US008748752B2

(12) United States Patent
Ootorii

(10) Patent No.: US 8,748,752 B2
(45) Date of Patent: Jun. 10, 2014

(54) MEMBER MOUNTING METHOD AND MEMBER ASSEMBLY

(75) Inventor: Hiizu Ootorii, Kanagawa (JP)

(73) Assignee: Sony Corporaton, Tokyo (JP)

( * ) Notice: Subject to any disclaimer, the term of this patent is extended or adjusted under 35 U.S.C. 154(b) by 177 days.

(21) Appl. No.: 13/367,887

(22) Filed: Feb. 7, 2012

(65) Prior Publication Data

US 2012/0224345 A1    Sep. 6, 2012

(30) Foreign Application Priority Data

Mar. 4, 2011    (JP) .................................. 2011-047344

(51) Int. Cl.
*H05K 1/16*    (2006.01)
(52) U.S. Cl.
USPC .......................................................... 174/260
(58) Field of Classification Search
USPC ................................... 174/260; 361/767–771
See application file for complete search history.

(56) References Cited

U.S. PATENT DOCUMENTS 5,898,574 A * 4/1999 Tan et al. ....................... 361/777
7,687,723 B2 * 3/2010 Izuchi et al. .................. 174/260

FOREIGN PATENT DOCUMENTS

| JP | 2004-184429 | 7/2004 |
| JP | 2011-017924 | 1/2007 |
| JP | 2008-046367 | 2/2008 |
| JP | 2011-017925 | 1/2011 |

* cited by examiner

*Primary Examiner* — Jeremy C Norris
(74) *Attorney, Agent, or Firm* — Dentons US LLP

(57) ABSTRACT

A method for mounting a second member on a first member, wherein a pad layer is provided on the first member, and wherein an annular aperture portion exposing the first member to the bottom and having at least one discontinuous portion is provided in a region of the pad layer for mounting the second member having a mount face, the annular aperture portion having the same outer shape as the mount face of the second member is disclosed. The method includes: filling the aperture portion with a solder paste layer; and disposing the mount face of the second member on the solder paste layer, and melting and cooling the solder paste layer to mount the second member on the first member.

13 Claims, 5 Drawing Sheets

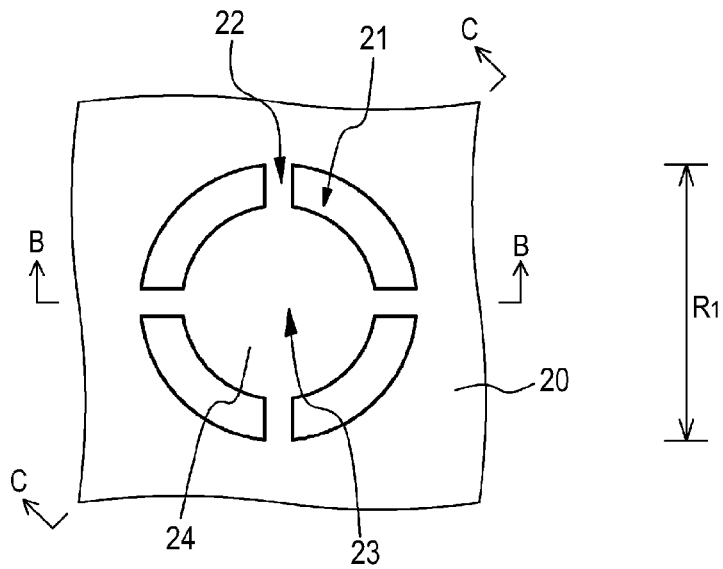
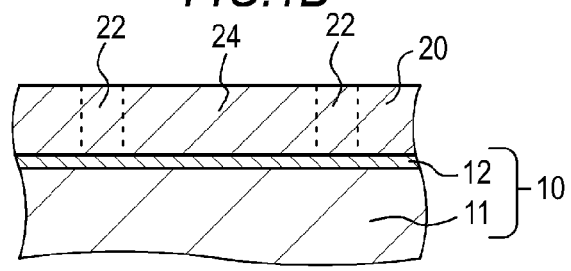
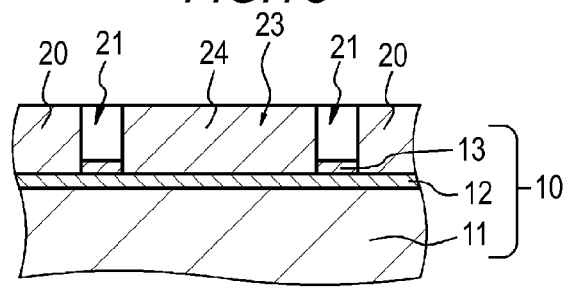
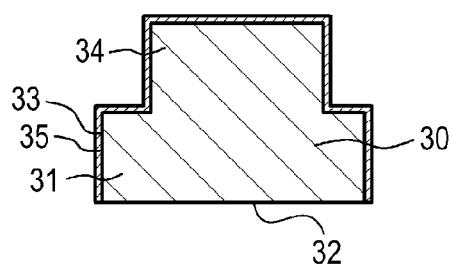

*FIG.3A*
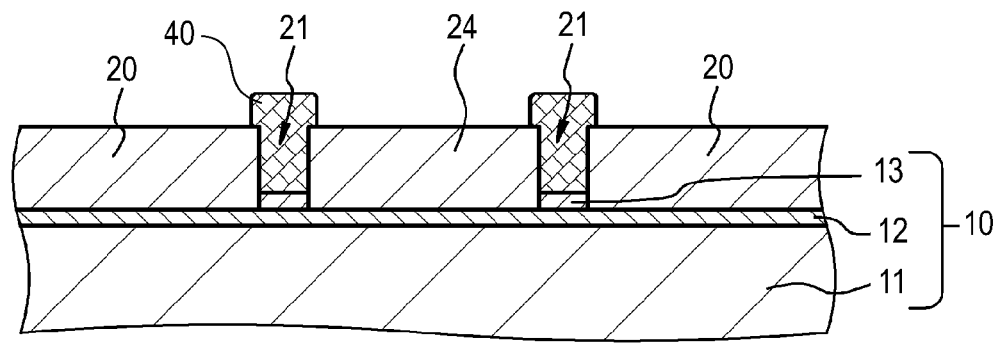
*FIG.3B*
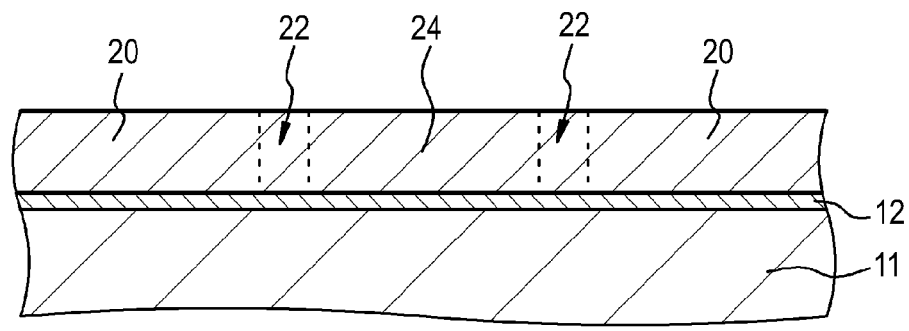
*FIG.3C₂*
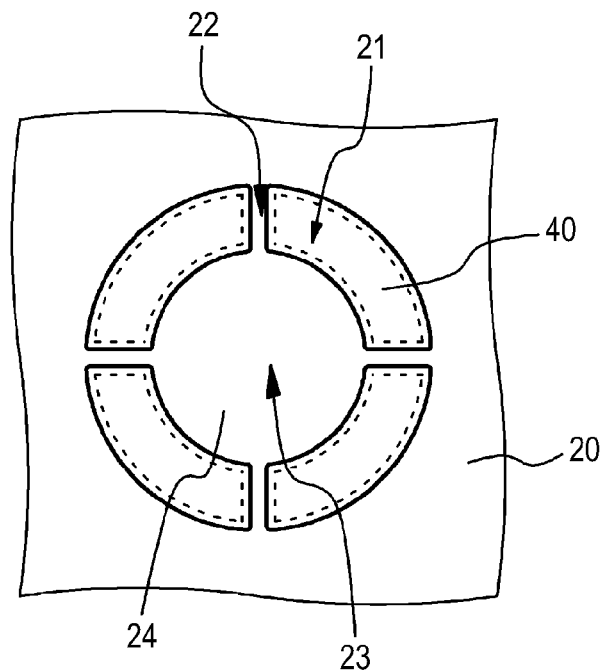

MEMBER MOUNTING METHOD AND MEMBER ASSEMBLY

FIELD

The present disclosure relates to methods for mounting two members, and to member assemblies configured from two members.

BACKGROUND

Construction of an optical transmission system on a printed board requires high-accuracy registration and anchoring of an optical connector that connects an element such as a semiconductor laser element and a photodetector to a member such as an optical fiber. Typically, an accuracy as high as about ±10 µm is needed for the light axis registration. Taking as an example the PT optical connectors developed by The National Institute of Advanced Industrial Science and Technology and NEC Corporation and specified in JPCA-PE03-01-065 Detail Specification for Optical Board Connector type PT using Glass Fibres, a registration accuracy of, for example, ±3 µm or less is required between the PT guide pin, a registration pin of the PT optical connector, and the guide hole, a registration hole provided for a PT optical module, or between the PT guide pin, a registration pin of a PT optical module and the guide hole, a registration hole provided for the PT optical connector. Further, the optical connectors disclosed in, for example, JP-A-2011-017924, JP-A-2011-017925, JP-A-2008-046367, and JP-A-2004-184429 also use a guide pin and a guide hole for the registration between the optical connector and a module main body or between the optical connectors. Further, high registration accuracy is also often required, for example, in mounting various electronic components on a printed board, or another substrate on a printed board.

SUMMARY

When the main body portion of a PT optical connector or PT optical module mounting a PT guide pin is amount substrate such as a printed board, a designated tool such as a high-accuracy mounter is needed for the accurate registration and mounting on the mount substrate. This is the major cause of the high assembly cost. The same problem occurs when mounting various electronic components or another substrate on a printed board realized by a mount substrate.

Accordingly, it is desirable to provide a member mounting method that enables accurate and easy mounting of two members, and a member assembly configured from two members based on the member mounting method.

An embodiment of the present disclosure is directed to a method for mounting a second member on a first member, wherein a pad layer is provided on the first member, and wherein an annular aperture portion exposing the first member to the bottom and having at least one discontinuous portion is provided in a region of the pad layer for mounting the second member having a mount face, the annular aperture portion having the same outer shape as the mount face of the second member. The method includes: filling the aperture portion with a solder paste layer; disposing the mount face of the second member on the solder paste layer, and melting and cooling the solder paste layer to mount the second member on the first member. Note that, when filling the aperture portion with the solder paste layer, the solder paste layer may fill the aperture portion either completely or incompletely. Further, when filling the aperture portion with the solder paste layer, the solder paste layer may slightly bulges beyond the aperture portion onto the edge on the pad layer to form the solder paste layer thereon.

Another embodiment of the present disclosure is directed to a member assembly as an assembly of a first member that includes a pad layer, and a second member that has a mount face. The member assembly includes an annular aperture portion in a second member-mounting region of the pad layer so as to expose the first member to the bottom and form at least one discontinuous portion. The annular aperture portion has the same outer shape as the mount face of the second member, and a solder paste layer fills the aperture portion to mount the second member on the first member.

In the member mounting method or the member assembly of the embodiment of the present disclosure, an annular aperture portion is provided in a second member-mounting region of the pad layer so as to expose the first member to the bottom and form at least one discontinuous portion (joint portion), the second member having a mount face. Further, the annular aperture portion has the same outer shape as the mount face of the second member. This enables the second member to be mounted on the first member by self-aligning with the first member, using the solder paste layer. Further, the melting of the solder paste layer does not leave a gas component at the interface between the solder paste layer and the mount face of the second member, because a flux or other gas components contained in the solder paste layer can be released to outside via the discontinuous portion (joint portion) formed in the annular aperture portion. The second member can thus be mounted on the first member both accurately and easily.

BRIEF DESCRIPTION OF THE DRAWINGS

FIG. 1A is a partial schematic plan view of a pad layer of a first embodiment; FIG. 1B is a schematic partial cross sectional view of a first member including the pad layer; FIG. 1C is a schematic partial cross sectional view of the first member including the pad layer as viewed from a different direction from that in FIG. 1B; FIG. 1D is a schematic cross sectional view of a second member.

FIGS. 3A and 3B are schematic partial end views taken along the lines C-C and B-B in FIG. 1A, explaining a member mounting method of the first embodiment; FIG. 3C is a partial schematic plan view of the pad layer and a solder paste layer.

DETAILED DESCRIPTION

Figure 2A:
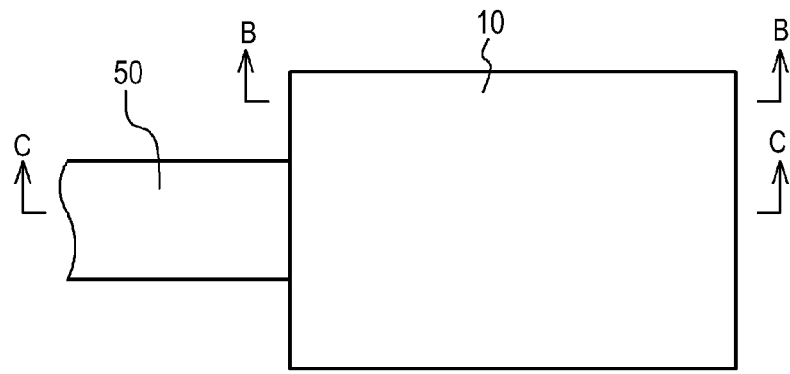
FIG. 2A is a schematic view of the first member and other components as viewed from above.

The following will describe the present disclosure based on an embodiment and example with reference to the accompanying drawings. It should be noted that the present disclosure is not limited to the following embodiment and example, and the numerical values and materials presented in the following embodiment and example are illustrative. Descriptions will be given in the following order.

1. Overall descriptions, including the member mounting method and member assembly of the present disclosure
2. First Embodiment (the member mounting method and the member assembly of the present disclosure), and other

[Overall Descriptions, Including the Member Mounting Method and Member Assembly of the Present Disclosure]

The member mounting method or member assembly according to an embodiment of the present disclosure may be configured to include a second member that has a mount face and a side face extending from the mount face, and that may be made of copper, a copper alloy, aluminum, or an aluminum alloy. The side face of the second member may have a film of poor solder wettability (for example, a film with solder wettability poorer than that of the mount face of the second member). Note that, in this case, the mount face of the second member may have a film of good solder wettability (for example, a film with better solder wettability than that of the film formed on the side face of the second member).

In the member mounting method of the present disclosure including the foregoing preferred embodiment, the mount face of the second member may be disposed on a solder paste layer, and the solder paste layer may be melted so that the second member mounts itself on the first member by self-aligning, using the surface tension created by the melting of the solder paste layer.

In the member mounting method or member assembly of the present disclosure including the foregoing preferred embodiment and configurations, the annular aperture portion has the same outer shape as the mount face of the second member. As used herein, "the same outer shape" encompasses a homothetic shape. Specifically, it is preferable that, for example, $0.90 < R_1/R_2 < 1.1$ be satisfied, where $R_1$ is the diameter of the outer shape of the annular aperture portion, and $R_2$ is the diameter of the outer shape of the mount face of the second member.

Further, in the member mounting method or member assembly of the present disclosure including the foregoing preferred embodiment and configurations, the annular aperture portion may have four discontinuous portions, and the four discontinuous portions may be disposed with 4-fold rotational symmetry. However, the configuration of the discontinuous portions is not limited to this, and, for example, may be such that there is 2-fold rotational symmetry (two discontinuous portions in the annular aperture portion), 3-fold rotational symmetry (three discontinuous portions in the annular aperture portion), or, more broadly, N-fold rotational symmetry with N discontinuous portions in the annular aperture portion (where N is a natural number of 2 or more). Further, the discontinuous portions may be disposed with no rotational symmetry.

Further, in the member mounting method or member assembly of the present disclosure including the foregoing preferred embodiment and configurations, the outer shape of the annular aperture portion may be circular. However, the outer shape of the annular aperture portion is not limited to this, and may be a triangle, a round triangle, a quadrangle, a round quadrangle, a polygon, a round polygon, an ellipsoid, or a series of block shapes or small circles arranged on a virtual circumference of the aperture portion. The inner shape of the annular aperture portion may be homothetic to the outer shape. However, the inner shape of the annular aperture portion is not limited to this, and the annular aperture portion may have essentially any inner shape.

Further, in the member mounting method or member assembly of the present disclosure including the foregoing preferred embodiment and configurations, the portion of the first member exposed to the bottom of the aperture portion may be a copper layer (or a copper foil), or a nickel layer formed on a copper layer (or a copper foil). However, the material is not limited to this, and any material may be used, as long as it can be bonded to the solder paste layer. Note that the first member except for the portion exposed to the bottom of the aperture portion may have any configuration, including, for example, various types of printed boards and printed circuit boards, and substrates.

Further, in the member mounting method or member assembly of the present disclosure including the foregoing preferred embodiment and configurations, the mount face of the second member may be formed using materials having good solder wettability and solderability, such as copper, a copper alloy, aluminum, an aluminum alloy, gold, and platinum. Further, the second member may be formed using a plastic material (for example, engineering plastic material) having heat resistance that can withstand the melting temperature of the solder paste layer, and a metallic or alloy layer of copper, a copper alloy, aluminum, or an aluminum alloy may be formed on the mount face of the second member. Solder wettability can be evaluated by, for example, solder contact angle measurements, or cross section analysis of the bonded interface. Solder wettability is determined as desirable when the contact angle is small, or when an alloy is formed with the solder at the bonded interface. Solder wettability is determined as poor when the contact angle is large, or when there is no alloy formation.

Further, in the member mounting method or member assembly of the present disclosure including the foregoing preferred embodiment and configurations (hereinafter, also referred to collectively as simply "the present disclosure"), the outer shape of the aperture portion crosses the discontinuous portions (joint portions). The space with the shape of the inside of the annular aperture portion is occupied by a portion of the pad layer, and the discontinuous portions (joint portions) are also configured from a portion of the pad layer.

The first member of the present disclosure may be, for example, the main body portion of the PT optical connector or PT optical module specified in JPCA-PE03-01-06S Detail Specification for Optical Board Connector type PT using Glass Fibres. The second member of the present disclosure may be, for example, the PT guide pin (registration pin) of the PT optical connector or PT optical module. Aside from these non-limiting examples, other examples of the first member of the present disclosure include the main body portion of various types, configurations, and forms of optical connectors; the main body portion of various types, configurations, and forms or optical modules; various printed boards and printed circuit boards, and substrates; various display devices, including liquid crystal display devices, organic electroluminescence (organic EL) display devices, and electrophoretic display devices; various electronic components such as switches and sensors; and mechanical components. Other examples of the second member of the present disclosure include a registration pin to be mounted to the main body portion of various types, configurations, and forms of optical connectors, a registration pin to be mounted to the main body portion of various types, configurations, and forms of optical modules; a registration pin to be mounted to various printed boards and printed circuit boards, substrates, and various types of display devices and electronic components; and a mechanical component main body that requires inexpensive and accurate registration. Examples of components and articles used for mounting the member assembly of the first member and the second member using the second member for registration include PT optical connectors, PT optical modules, various types, configurations, and forms of optical connectors, various types, configurations, and forms of optical modules, various printed boards, printed circuit boards, and substrates, and various display devices and electronic components. The pad layer may be realized by, for example, a photosensitive resin layer, or a photosensitive resin sheet or film, specifically a photosensitive polyimide film. The pad layer provided on the first member may be provided in at least a part of the first member. The solder paste layer may be formed using a known solder paste.

[First Embodiment]

Figure 2B:
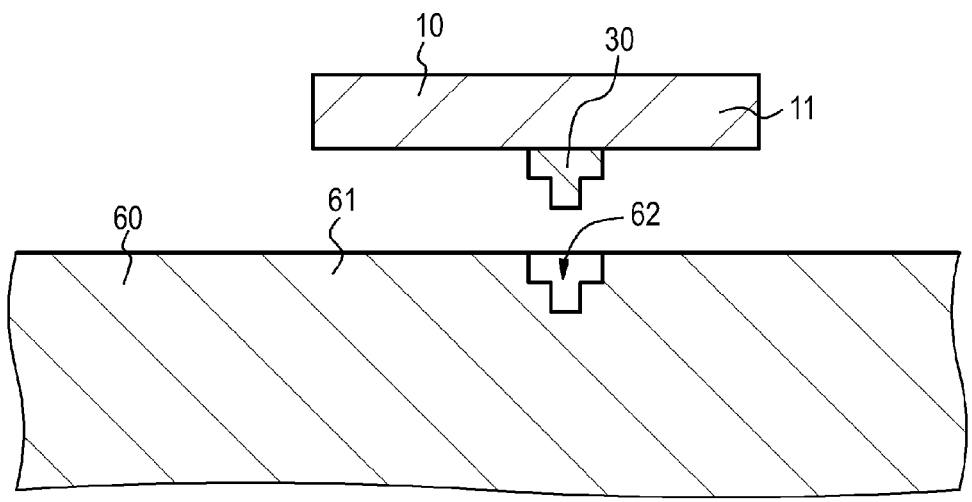
FIGS. 2B and 2C are schematic partial cross sectional views of the first member and other components, taken along the lines B-B and C-C in FIG. 2A.
Figure 2C:
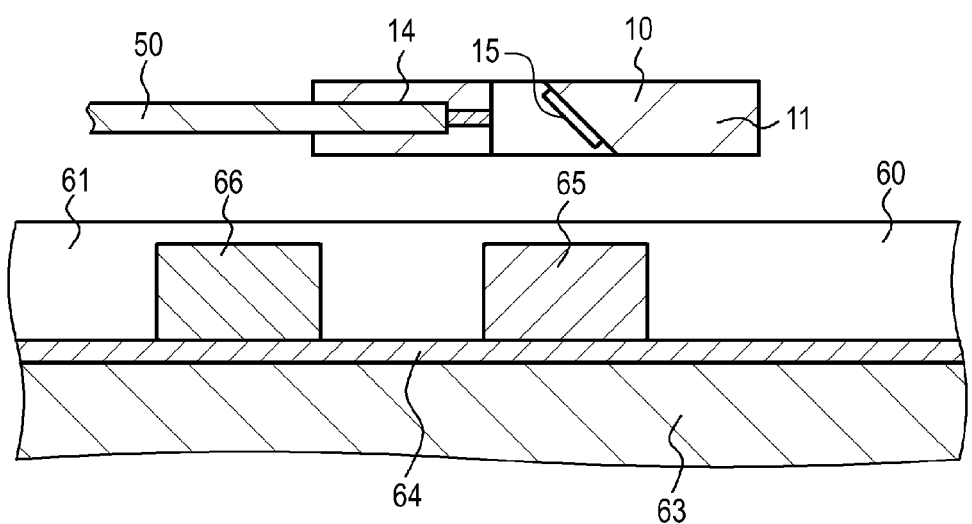

The first embodiment relates to the mounting method of the two members of the present disclosure, and to the member assembly configured from the two members. In the first embodiment, a first member 10 is the main body portion of the PT optical connector specified in JPCA-PE03-01-06S Detail Specification for Optical Board Connector type PT using Glass Fibres. A second member 30 is the PT guide pin (registration pin) of the PT optical connector. FIG. 1A illustrates a partial schematic plan view of the pad layer of the first embodiment. FIG. 1B is a schematic partial cross sectional view of the first member including the pad layer, taken along the line B-B in FIG. 1A. FIG. 1C is a schematic partial cross sectional view of the first member including the pad layer, taking along the line C-C in FIG. 1A. FIG. 1D is a schematic cross sectional view of the second member. FIG. 2A shows a schematic illustration of the first member and other components as viewed from above. FIGS. 2B and 2C are schematic partial cross sectional views of the first member and other components, taken along the lines B-B and C-C in FIG. 2A.

The member assembly of the first embodiment is a member assembly that includes the first member 10 provided with a pad layer 20, and the second member 30 that has a mount face 32. The pad layer 20 has an annular aperture portion 21 in a region where the second member 30 is mounted. The annular aperture portion 21 exposes the first member 10 to the bottom, and has at least one discontinuous portion (joint portion) 22. The annular aperture portion 21 has the same outer shape as the mount face 32 of the second member 30. The second member 30 is mounted on the first member 10 with a solder paste layer 40 applied to substantially the whole surface of the aperture portion 21. In the first embodiment, the annular aperture portion 21 has four discontinuous portions 22, and these four discontinuous portions 22 are disposed with 4-fold rotational symmetry. Specifically, the discontinuous portions 22 are disposed at the 0 o'clock, 3 o'clock, 6 o'clock, and 9 o'clock positions of the annular aperture portion 21 as viewed from the center of the discontinuous portions 22. The annular aperture portion 21 has a circular outer shape, and the inner shape thereof is also circular, homothetic to the outer shape. The space 23 with the shape of the inside of the annular aperture portion 21 is occupied by a portion of the pad layer (shown as a pad layer center region 24), and the discontinuous portions 22 are also configured from portions of the pad layer. The outer shape and inner shape of the aperture portion 21 cross the discontinuous portions 22.

The first member 10, specifically the base material 11 as the main body portion of the PT optical connector is fabricated from, for example, a heat-resistant resin, and includes, as illustrated in FIG. 2C, an optical fiber anchoring unit 14 that anchors an optical fiber 50, and a reflecting mirror 15 that creates a 90° angle with the travel direction of the light rays that emerges from the optical fiber 50, or of the incident rays that fall on the optical fiber 50. A copper layer 12 and a nickel layer 13 are formed by plating in a portion of the first member (main body portion of the PT optical connector) 10, and the pad layer 20 of 25 μm-thick photosensitive polyimide resin is formed over these layers 12 and 13. The portion of the first member 10 exposed to the bottom of the aperture portion 21 provided in the pad layer 20 is configured from, for example, the copper layer 12 (thickness of 12.5 μm) and the nickel layer 13 (thickness of 3 μm) formed on the copper layer 12. Note that the nickel layer 13 is formed by plating on the copper layer 12 exposed to the bottom of the aperture portion 21. Alternatively, a gold layer may be formed on the nickel layer 13 by plating, or the nickel layer may not be formed.

The second member 30 as the PT guide pin has a side face 33 that extends from the mount face 32. The mount face 32 of the second member 30 is formed, using, for example, copper. Specifically, the second member 30 is made from copper. More specifically, the second member 30 is configured from a columnar lower member 31 and a columnar upper member 34, and formed as one unit in the shape of a hat. The bottom surface of the columnar lower member 31 corresponds to the mount face 32, and the side face of the columnar lower member 31 corresponds to the side face 33 that extends from the mount face 32. Further, a film 35 of poor solder wettability, specifically, a titanium film (thickness of 0.1 μm), or a heat-resistant coating film (for example, thickness of about 10 μm) is formed on the side face 33 of the second member 30 (specifically, in portions where solder wetting needs to be prevented, more specifically, on the whole surface of the second member 30 except the mount face 32, or on the side face 33 or the lower portion of the side face 33).

In the first embodiment, a PT optical module 60 is used as the component used for mounting the member assembly of the first member 10 and the second member 30 using the second member 30 for registration. The second member 30 is fitted to a guide hole 62 provided as a registration hole of the PT optical module 60.

As illustrated in FIG. 2B, the guide hole 62 is provided in the main body portion 61 of the PT optical module 60. The main body portion 61 is formed from, for example, epoxy resin. Further, as illustrated in FIG. 2C, a printed circuit board 63 is provided inside the main body portion 61, and an element 65 and a driver IC 66 are mounted on wires 64 provided on the printed circuit board 63. Note that the element is configured from, for example, a surface-emitting laser element (vertical resonator laser, VCSEL), or a photodiode. The first member 10 as the main body portion of the PT optical connector is fastened to the main body portion 61 of the PT optical module 60 using a clamp spring (not illustrated).

The second member 30 can be fabricated as follows, for example. Specifically, a copper round rod is prepared, and cut into a predetermined length to provide a pellet. The pellet is placed in a mold for the second member 30 having the columnar lower member 31 and the columnar upper member 34, and molded to obtain the second member 30 having the columnar lower member 31 and the columnar upper member 34. The second member 30 is then placed on a support member with the mount face 32 in contact therewith, and a titanium film 35 is deposited on the whole surface of the second member 30 except for the mount face 32 by sputtering in a sputtering apparatus.

The lower member 31 of the second member 30 is a columnar member having a diameter of 2.00 mm (tolerance h7) and a height of 0.70 mm. The upper member 34 is a columnar member with a diameter of 1.00 mm and a height of 0.80 mm. Specifically, the diameter $R_2$ of the outer shape of the mount face 32 of the second member 30 is 2.00 mm. The diameter $R_1$ of the outer shape of the annular aperture portion 21 is 2.00 mm, and the diameter $R_1'$ of the inner shape is 1.40 mm. The width of the discontinuous portion (joint portions) 22 is 0.20 mm. Note that $R_1/R_2=1.00$.

In the following, the mounting method of two members of the first embodiment will be described with reference to the schematic partial end views of the first member 10 (FIGS. 3A and 3B, FIG. 4A, and FIG. 5A), the partial cross sectional views (FIG. 4B, FIG. 5B), and the partial schematic plan view of the pad layer and the solder paste layer (FIG. 3C). Note that, in the drawings, the center line of the aperture portion 21 is denoted by $CL_1$, and the center line of the second member 30 by $CL_2$.

[Step-100]

First, a photosensitive polyimide film was laminated on portions of the first member 10 provided with the copper layer 12. The polyimide film was then exposed and developed to form the pad layer 20 having the aperture portion 21 with discontinuous portions (joint portions) 22 in two portions. The nickel layer 13 was then formed by plating on the copper layer 12 exposed to the bottom of the aperture portion 21. The second member 30 was cleaned by successively performing ultrasonic washing using acetone, water washing, and soft etching of the copper exposed to the mount face 32 of the second member 30.

[Step-110]

Thereafter, the aperture portion 21 was filled with the solder paste layer 40, for which, for example, a commercially available Sn-3.0Ag-0.5Cu material was used. Specifically, as illustrated in FIGS. 3A, 3B, and 3C, the solder paste layer 40 was applied to substantially the whole surface of the aperture portion 21 using a screen printing method. Note that the solder paste layer 40 slightly bulged beyond the aperture portion 21 onto the edge on the pad layer 20 to form the solder paste layer 40 thereon. However, this is not a requirement.

[Step-120]

Figure 4A:
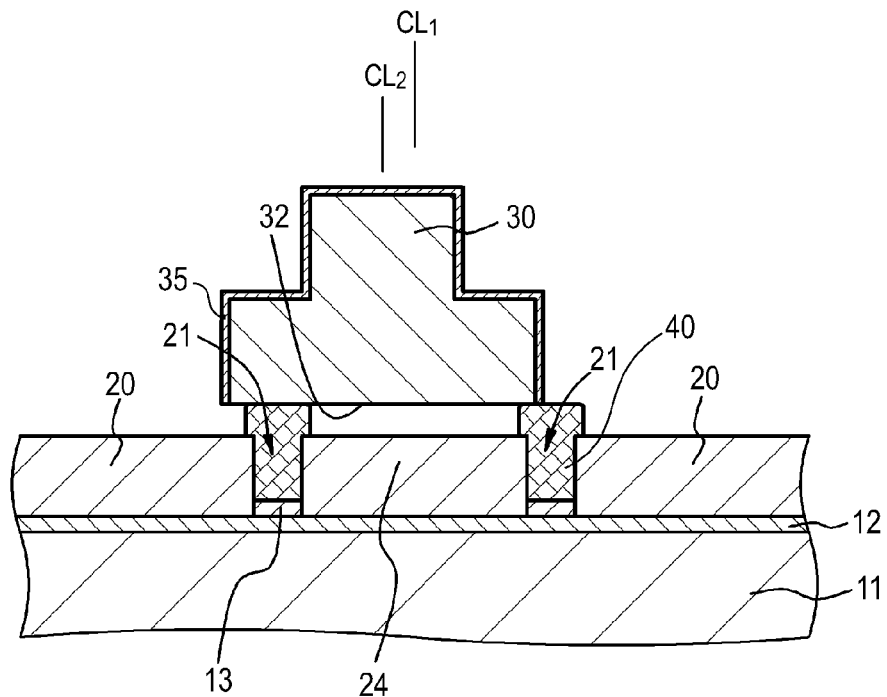
FIGS. 4A and 4B are a schematic partial end view and a partial cross sectional view, respectively, taken along the lines C-C and B-B in FIG. 1A, explaining the member mounting method of the first embodiment as a continuation of FIGS. 3A and 3B.
Figure 4B:
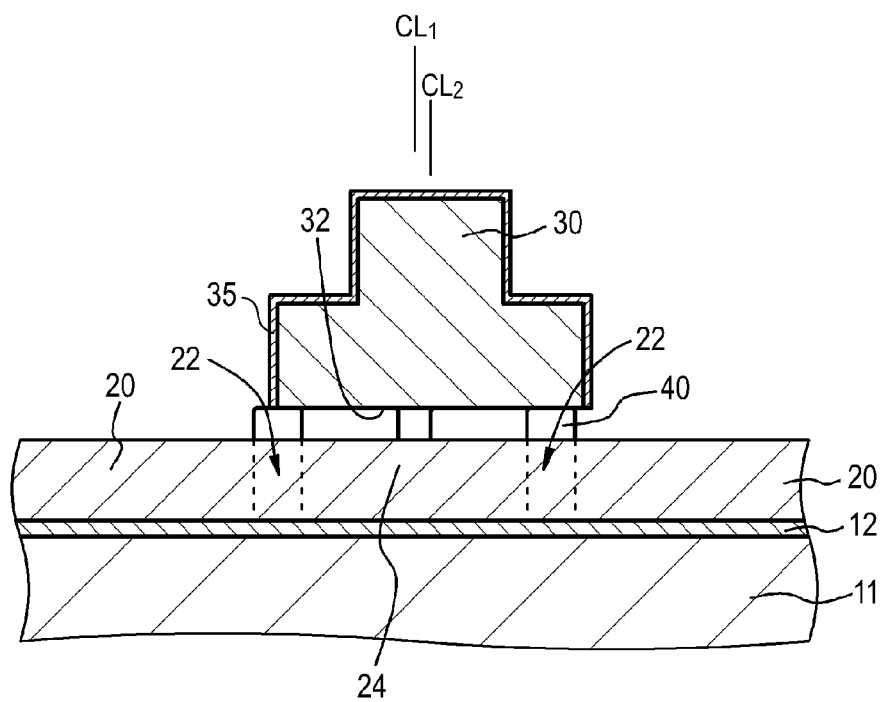
Figure 5A:
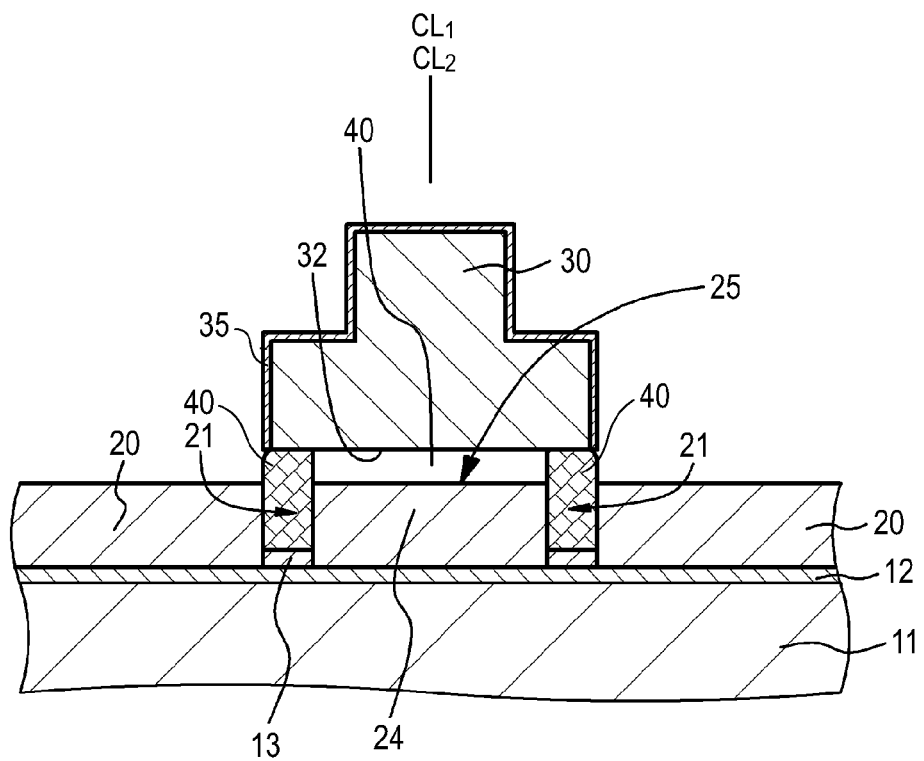
FIGS. 5A and 5B are a schematic partial end view and a partial cross sectional view, respectively, taken along the lines C-C and B-B in FIG. 1A, explaining the member mounting method of the first embodiment as a continuation of FIGS. 4A and 4B.
Figure 5B:
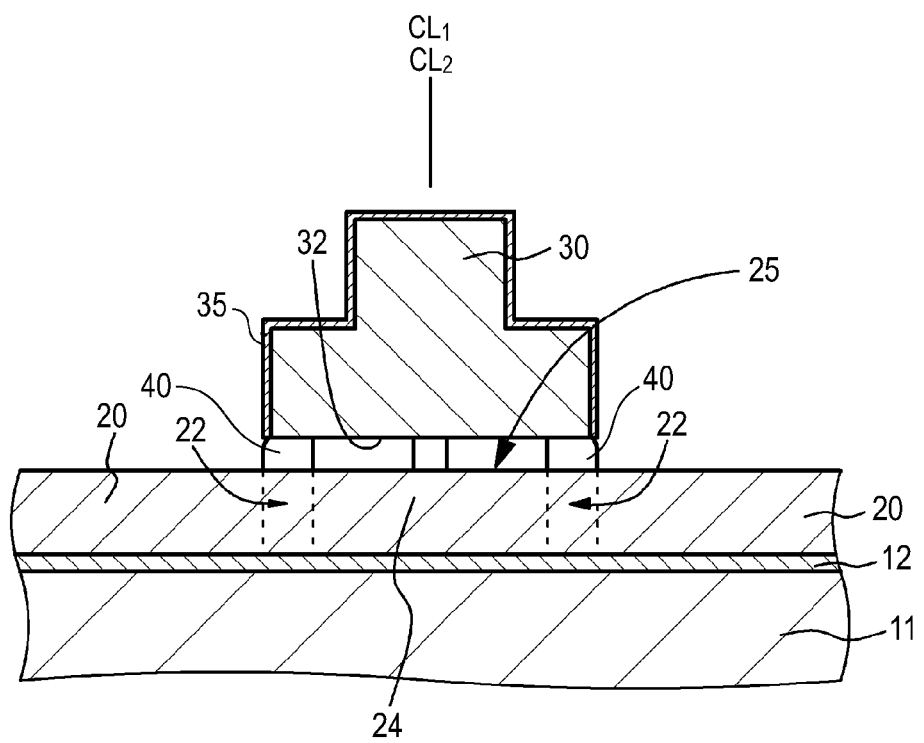

The next step is to dispose the mount face 32 of the second member 30 on the solder paste layer 40 (see FIGS. 4A and 4B). Specifically, the second member 30 was placed on the solder paste layer 40 in a manner allowing the solder paste layer 40 to contact the mount face 32 of the second member 30.

[Step-130]

The solder paste layer 40 was then melted and cooled to mount the second member 30 on the first member 10. Specifically, the first member 10 and the second member 30 were heated to 260° C. as a whole using a reflow method, so as to reflow the solder paste layer 40. This allowed the second member 30 to be mounted on the first member 10 by self-aligning under the surface tension created by the melting of the solder paste layer 40 (see FIGS. 5A and 5B). Specifically, as illustrated in FIGS. 4A and 4B, the second member 30 moves on the solder paste layer 40 in the molten state under the surface tension created by the melting of the solder paste layer 40, allowing the center of the second member 30 to coincide with the center of the aperture portion 21, even when the second member 30 is placed on the solder paste layer 40 off-center with the center of the aperture portion 21 in Step-120. Accordingly, the placement of the second member 30 on the solder paste layer 40 in Step-120 does not require high accuracy. Further, because the solder paste layer 40 has poor wettability against the pad layer 20 formed by the photosensitive polyimide film, the solder paste layer 40 melting on the pad layer 20, the discontinuous portions (joint portions) 22, and the pad layer center region 24 is repelled by the pad layer 20, the discontinuous portions 22, and the pad layer center region 24, and occupies inside the aperture portion 21 and the space over the aperture portion 21. The solder paste layer 40 after being melted can thus completely fill the aperture portion 21. That is, the solder paste layer 40 does not exist on the pad layer 20, the discontinuous portions 22, and the pad layer center region 24 after melting, and the discontinuous portions 22 and the pad layer center region 24 are separated from the mount face 32 of the second member 30 by a gap 25. Further, because of the film 35 of poor solder wettability formed on the whole surface of the second member 30 except for the mount face 32, the solder paste layer 40 after being melted does not adhere to the side face 33 of the second member 30.

For testing, member assemblies were produced in the same manner by varying the outer shape diameter ($R_1$) of the annular aperture portion 21 to 2.10 mm, 2.05 mm, 1.95 mm, and 1.90 mm.

Each member assembly was then measured to find the extent that the center of the second member 30 is off-center from the center of the aperture portion 21. The measurement results (unit: μm) are presented in the Table 1 below. The off-center distance (Δ1 to Δ5: unit in μm) was confined within 5 μm in all five samples when the outer shape diameters of the annular aperture portion 21 are 2.05 mm, 2.00 mm, and 1.95 mm. Specifically, the registration accuracy was confined within 0.25%(=0.005/2.00×100). On the other hand, the off-center distance did not fall within the 5 μm range in all five samples when the outer shape diameters of the annular aperture portion 21 are 2.10 mm and 1.90 mm. It was therefore found that the off-center distance could be kept low when $0.90<R_1/R_2<1.1$. Note that even the same testing conducted for samples with the outer shape diameters of annular aperture portion 21 other than 2.00 mm revealed that the registration accuracy for the aperture portion 21 of the second member 30 could be confined within 0.25% when $0.90<R_1/R_2<1.1$.

TABLE 1

| R1 | Δ1 | Δ2 | Δ3 | Δ4 | Δ5 | Δ (mean value) | Δ (standard deviation) |
|---|---|---|---|---|---|---|---|
| 1.90 mm | 13.3 | 4.2 | 18.1 | 7.2 | 4.3 | 9.42 | 6.10 |
| 1.95 mm | 3.6 | 1.8 | 0.0 | 3.0 | 1.2 | 1.92 | 1.43 |
| 2.00 mm | 0.6 | 3.0 | 1.2 | 3.0 | 1.8 | 1.92 | 1.07 |
| 2.05 mm | 1.2 | 4.8 | 3.6 | 0.6 | 2.4 | 2.52 | 1.72 |
| 2.10 mm | 3.9 | 2.4 | 12.0 | 0.6 | 0.6 | 3.90 | 4.73 |

In the member mounting method or the member assembly of the present disclosure, the annular aperture portion 21 exposing the first member 10 to the bottom and having at least one discontinuous portion 22 is provided in the pad layer 20 region for the second member 20 having the mount face 32. Further, the annular aperture portion 21 has the same outer shape as the mount face 32 of the second member 30. Thus, the second member 30 can self-align with the first member 10 when being mounted on the first member 10 with the solder paste layer 40. Further, the melting of the solder paste layer 40 does not leave a gas component at the interface between the solder paste layer 40 and the mount face 32 of the second member 30, because a flux or other gas components contained in the solder paste layer 40 can be released to outside via the discontinuous portions 22 formed in the annular aperture portion 21, or more specifically via the gap 25. The second member 30 can thus be mounted on the first member 10 both accurately and easily.

Further, because of the gap 25, the portion of the mount face 32 of the second member 30 not in contact with the solder paste layer 40 can be washed. Further, an underfill can fill the space between this portion of the mount face 32 of the second member 30 and the discontinuous portions 22 and the pad layer center region 24. This improves the bonding strength of the second member 30 with the discontinuous portions 22 and the pad layer center region 24. The underfill used herein is a sealing resin used to improve the reliability of the interconnections for an IC package. By being applied between the second member 30 and the discontinuous portions 22, the underfill can easily enter the gap 25 between the second member 30 and the discontinuous portions 22 and the pad layer center region 24 by capillary action.

The member mounting method and the member assembly of the present disclosure have been specifically described based on the preferred embodiment and example. However, the member mounting method and the member assembly of the present disclosure are not limited to the foregoing embodiment and example. The first member and the second member described in the foregoing embodiment and example are merely illustrative, and may be varied as appropriate. For example, a PT optical module may be used as the member assembly configured from the first member and the second member, and a PT optical connector may be used as the component for mounting the member assembly using the second member for registration. Further, as the member assembly, an optical connector or an optical module configured or structured differently from those described above, for example, such as the optical connectors and optical modules disclosed in JP-A-2011-017924, JP-A-2011-017925, JP-A-2008-046367, and JP-A-2004-184429 may be used. Further, as the first member, for example, a printed board, a printed circuit board, a substrate, a display device, or an electronic component may be used, whereas as the second member a registration pin to be mounted to various members, including a printed board, a printed circuit board, a substrate, a display device, and an electronic component may be used.

In the foregoing Example, the titanium film 35 of poor solder wettability was deposited on the side face 33 of the second member 30. However, for example, a polyimide resin layer may be formed instead. Specifically, a polyimide resin layer may be formed on the side face 33 of the second member 30 by dipping the second member 30 in a polyimide resin solution after mounting a retaining member in contact with the mount face 32 of the second member 30 via a weak adhesive layer, and then heating the polyimide resin layer formed on the whole surface of the second member 30 except for the mount face 32. Alternatively, the second member may be produced from a heat-resistant plastic material (for example, polyimide resin, or engineering plastic material) that can withstand the melting temperature of the solder paste layer, and, for example, a metallic layer of copper may be formed on the mount face of the second member.

The present disclosure contains subject matter related to that disclosed in Japanese Priority Patent Application JP 2011-047344 filed in the Japan Patent Office on Mar. 4, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method for mounting a second member on a first member, wherein a pad layer is provided on the first member, and wherein an annular aperture portion exposing the first member to a bottom of the aperture and having at least one discontinuous portion is provided in a region of the pad layer for mounting the second member having a mount face, the annular aperture portion having the same outer shape as the mount face of the second member, the method comprising:
    filling the aperture portion with a solder paste layer; and
    disposing the mount face of the second member on the solder paste layer, and melting and cooling the solder paste layer to mount the second member on the first member,
    wherein,
    the second member has a side face that extends from the mount face and is formed from copper, a copper alloy, an aluminum, or an aluminum alloy, and
    a film of poor solder wettability is formed on the side face of the second member.

2. The method according to claim 1, wherein the solder paste layer is melted after disposing the mount face of the second member on the solder paste layer, so as to mount the second member on the first member by allowing the second member to self-align under the surface tension created by the melting of the solder paste layer.

3. The method according to claim 1, wherein $0.90 < R1/R2 < 1.1$ is satisfied, where R1 is the diameter of the outer shape of the annular aperture portion, and R2 is the diameter of the outer shape of the mount face of the second member.

4. The method according to claim 1, wherein the annular aperture portion has N discontinuous portions (where N is a natural number of 2 or more), and the N discontinuous portions are disposed with N-fold rotational symmetry.

5. The method according to claim 1, wherein the outer shape of the annular aperture portion is circular.

6. The method according to claim 1, wherein the first member in the portion exposed to the bottom of the aperture portion is formed by a copper layer and a nickel layer formed on the copper layer.

7. The method according to claim 1, wherein the mount face of the second member is configured from copper, a copper alloy, aluminum, or an aluminum alloy.

8. A member assembly comprising:
    a first member that includes a pad layer;
    a second member that has a mount face;
    an annular aperture portion provided in a second member-mounting region of the pad layer so as to expose the first member to a bottom of the aperture and form at least one discontinuous portion, wherein the annular aperture portion has the same outer shape as the mount face of the second member; and
    a solder paste layer filling the aperture portion to mount the second member on the first member,
    wherein,
    the second member has a side face that extends from the mount face and is formed from copper, a copper alloy, an aluminum, or an aluminum alloy, and
    a film of poor solder wettability is formed on the side face of the second member.

9. The member assembly according to claim 8, wherein $0.90 < R1/R2 < 1.1$ is satisfied, where R1 is the diameter of the outer shape of the annular aperture portion, and R2 is the diameter of the outer shape of the mount face of the second member.

10. The member assembly according to claim 8, wherein the annular aperture portion has N discontinuous portions (where N is a natural number of 2 or more), and wherein the N discontinuous portions are disposed with N rotational symmetry.

11. The member assembly according to claim 8, wherein the outer shape of the annular aperture portion is circular.

12. The member assembly according to claim 8, wherein the first member in the portion exposed to the bottom of the aperture portion is formed by a copper layer and a nickel layer formed on the copper layer.

13. The member assembly according to claim 8, wherein the mount face of the second member is configured from copper, a copper alloy, aluminum, or an aluminum alloy.

* * * * *